United States Patent
Loo et al.

(10) Patent No.: US 7,488,669 B2
(45) Date of Patent: Feb. 10, 2009

(54) METHOD TO MAKE MARKERS FOR DOUBLE GATE SOI PROCESSING

(75) Inventors: Josine Johanna Gerarda Petra Loo, Leuven (BE); Youri V. Ponomarev, Leuven (BE); David William Laidler, Leuven (BE)

(73) Assignees: Interuniversitair Microelektronica Centrum vzw (IMEC), Leuven (BE); Koninklijke Philips Electronics, Eindhoven (NL)

( * ) Notice: Subject to any disclaimer, the term of this patent is extended or adjusted under 35 U.S.C. 154(b) by 380 days.

(21) Appl. No.: 11/083,356

(22) Filed: Mar. 16, 2005

(65) Prior Publication Data
US 2005/0214985 A1    Sep. 29, 2005

(30) Foreign Application Priority Data
Mar. 17, 2004    (EP)    .................... 04101087

(51) Int. Cl.
*H01L 21/46*    (2006.01)
(52) U.S. Cl. ................ 438/462; 438/401; 257/E21.561
(58) Field of Classification Search ................ 438/401, 438/455, 462; 257/797, E21.561
See application file for complete search history.

(56) References Cited

U.S. PATENT DOCUMENTS

| 5,523,193 | A | * | 6/1996 | Nelson | 430/311 |
| 5,811,348 | A | * | 9/1998 | Matsushita et al. | 438/455 |
| 6,172,409 | B1 | * | 1/2001 | Zhou | 257/620 |
| 6,191,007 | B1 | * | 2/2001 | Matsui et al. | 438/459 |
| 6,269,322 | B1 | * | 7/2001 | Templeton et al. | 702/150 |
| 6,335,214 | B1 | | 1/2002 | Fung | |
| 2002/0044285 | A1 | * | 4/2002 | Pedersen et al. | 356/445 |

OTHER PUBLICATIONS

Gruber et al. (2001). Precise and simple optical alignment method for double-sided lithography. Applied Optics, vol. 40. No. 28, p. 5052-5055.*

* cited by examiner

*Primary Examiner*—Thanhha Pham
(74) *Attorney, Agent, or Firm*—Knobbe Martens Olson & Bear LLP

(57) ABSTRACT

A method of making at least one marker (MX) for double gate SOI processing on a SOI wafer is disclosed. The marker has a diffracting structure in a first direction and the diffracting structure is configured to generate an asymmetrical diffraction pattern during use in an alignment and overlay detection system for detection in the first direction.

8 Claims, 2 Drawing Sheets

METHOD TO MAKE MARKERS FOR
DOUBLE GATE SOI PROCESSING

BACKGROUND OF THE INVENTION

1. Field of the Invention

The present invention relates to a method to make a marker for double gate SOI processing. Also, the present invention relates to a marker for double gate SOI processing. Moreover, the present invention relates to a semiconductor device provided with such a marker for double gate SOI processing.

2. Description of the Related Technology

Such a marker is known from U.S. Pat. No. 6,335,214 B1 which discloses a SOI (silicon-on-insulator) circuit with double-gate transistors. A method for a double-gate transistor is disclosed wherein a back-side gate is created, which is self-aligned to the upper gate of the transistor.

A transfer method is used to generate marking features on the wafer backside comprising the formation of etch stop spacers on the edge of a gate stack and the etching of an alignment trench through the silicon device layer and through the buried oxide layer, so that deposition of an alignment layer on the bottom of the alignment trench provides a marker on the backside.

Since critical features sizes of semiconductor devices are 100 nm and less, in lithographic processing the requirements for (optical) alignment and overlay are high. In lithographic apparatuses, alignment and overlay detection is performed typically by detecting a plurality of diffracted beams (i.e., diffraction orders) generated by an impinging optical beam on an alignment marker.

Such alignment markers may comprise a grating of which the structure is modified in such a way that the intensity of some selected diffracted beams are biased with respect to the other diffracted beams of which the intensity is relatively reduced.

Due to the biasing of some selected diffraction orders, the diffraction pattern (i.e., the set of diffraction beams) becomes asymmetrical with respect to the impinging optical beam. By this measure the alignment and overlay detection method is generally improved.

However, the asymmetry of alignment signals and their detection in the lithographic apparatus is an obstacle for double gate SOI processing, where wafer bonding is performed. After wafer bonding, further lithographic processing is hindered since the signals generated by the alignment marker can not be detected anymore due to the disturbed asymmetry.

SUMMARY OF CERTAIN INVENTIVE ASPECTS

One aspect of the present invention relates to: a method to make at least one marker for double gate SOI processing on a SOI wafer, the at least one marker having a diffracting structure in a first direction and the diffracting structure being arranged for generating an asymmetrical diffraction pattern during use in an alignment and overlay detection system for detection in the first direction; the SOI wafer comprising a substrate, an oxidized layer on the substrate, and a semiconductor layer on top of the oxidized layer; the double gate SOI processing being performed on at least one die; the at least one die being located on the semiconductor layer and comprising at least an inner area arranged as a circuit area and an outer area arranged as scribe line area; the at least one marker being defined in the scribe line area; and the double gate SOI processing comprising a processing step for: separating the semiconductor layer from the oxidized layer, attaching the separated semiconductor layer as a turned-over semiconductor layer on a surface of a new substrate, with the original top surface of the semiconductor layer directed towards the surface of the new substrate, wherein the method provides a mirrored marker, the mirrored marker being the mirror image of the marker, by using a mirror operation around a second direction perpendicular to the first direction.

Advantageously, during further lithographic processing such a second alignment marker, as produced by embodiments of the method, generates the asymmetrical diffraction pattern as required by the alignment and overlay sensor of the lithographic apparatus. Moreover, since the second alignment marker is created during the same step as the creation of the first alignment marker their relative positions are defined. Alignment with the second alignment marker is now straightforward.

Also, inventive aspects relate to a semiconductor device comprising such a second alignment marker.

DETAILED DESCRIPTION OF CERTAIN INVENTIVE EMBODIMENTS

For the purpose of disclosing the invention, embodiments of the method and devices of the invention are described below.

Figure 1:
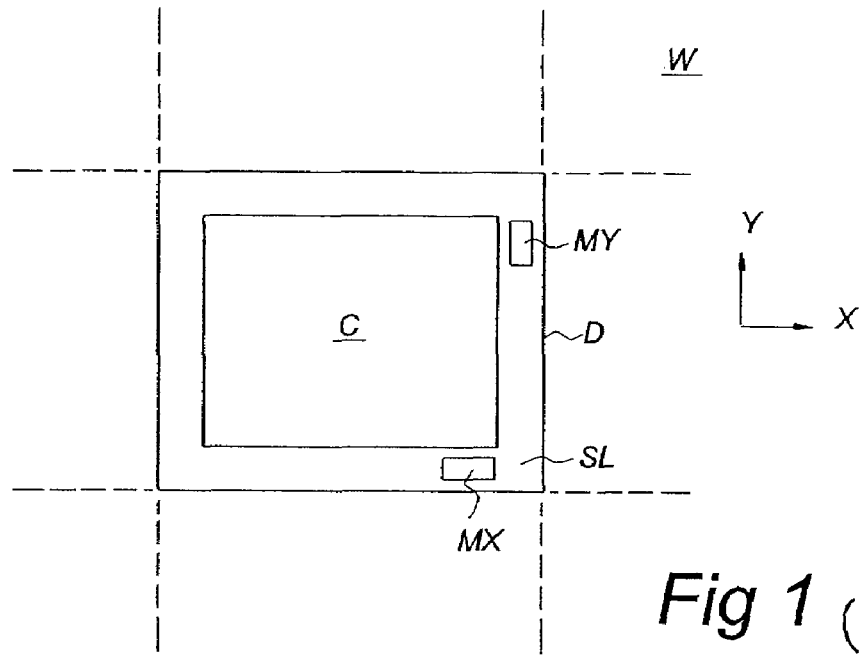
FIG. 1 schematically shows a plane view of a die from the prior art.

FIG. 1 schematically shows a plane view of a die from the prior art. On a semiconductor wafer W semiconductor devices are produced. The wafer estate required for a semiconductor device is a die D. Typically, a die is a substantially rectangular area. The wafer comprises a plurality of dies arranged in a matrix of rows running in a first direction X and columns running in a second perpendicular direction Y.

Within the area of the die D, an inner area C is available for creating electronic circuits which make up the semiconductor device.

Surrounding the inner area is a peripheral area, denoted as the scribe line area SL, which at some point of the manufacturing process will be sacrificed for separating the individual dies form each other.

The scribe line area SL comprises alignment and overlay markers. The alignment and overlay markers are used during a lithographic step in the manufacturing process to allow alignment of features in the die area relative to projection features on a mask. The projection features are to be imaged on a photosensitive layer covering the die area. Next, after projection of the mask image (with the projection features) on the photosensitive layer, development of the layer, and opening of the projection features (e.g. by reactive ion etching), subsequently a step for definition of the projected features (e.g., definition of doped areas, or definition of (semi)conducting or isolating areas, depending on the purpose of the mask) can be carried out.

Typically, alignment is required in both the X and Y direction. Therefore, a first alignment marker MX arranged for alignment in the X-direction and a second alignment marker MY arranged for alignment in the Y-direction are present in the scribe line area SL.

Figure 2:
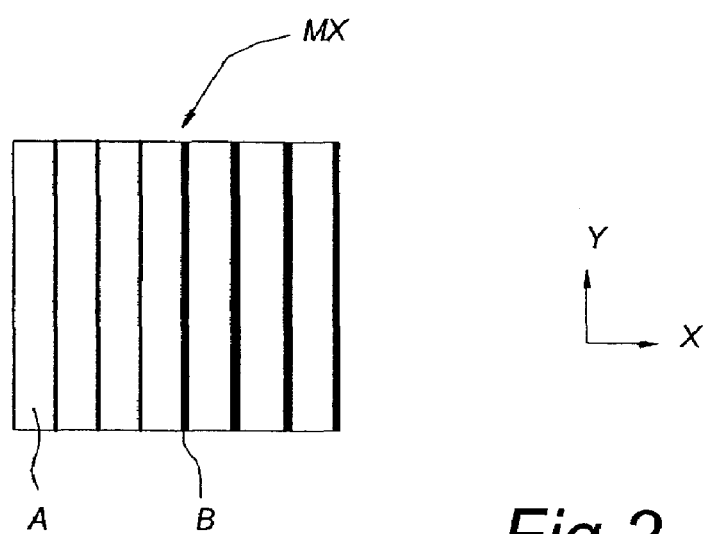
FIG. 2 schematically shows a plane view of an alignment marker from the prior art.

FIG. 2 schematically shows a plane view of an alignment marker from the prior art.

Such alignment markers comprise a grating of which the structure is modified in such a way that the intensity of some selected diffracted beams are biased with respect to the other diffracted beams of which the intensity is relatively reduced.

The grating comprises a plurality of first elements A and second elements B, each element type, in use, having a specific interaction with the impinging optical beam. As known to persons skilled in the art, the grating may, for example, comprise as elements A and B lines and trenches etched in the scribe line area SL, or a sequence of lines of different materials A and B.

Due to the specific composition of the grating (width and/or the alternation sequence of elements A and B) the diffraction pattern to be generated by the grating comprises some biased diffraction orders. In FIG. 2 the grating is schematically shown to have a variation of the width of the individual elements A and B over the X-direction for generating such a biased diffraction pattern. Moreover, due to the biasing of some selected diffraction orders, the diffraction pattern (i.e., the set of diffraction beams) becomes asymmetrical with respect to the impinging optical beam, i.e., the diffraction orders to be measured are arranged substantially on one side of the normal of the grating surface. (The purpose of providing such an asymmetry relates to properties of the alignment detection system as used in the lithographic apparatus, in this case).

It is noted that first (MX) and second (MY) markers may be identical gratings, but they may differ as well.

During double gate SOI processing, the dies are created on a semiconductor (silicon) layer on top of an oxidized Si substrate (a SOI wafer). At some instance during manufacturing, the semiconductor layer will be separated from the oxidized Si substrate, turned upside down, and by means of wafer bonding be attached with the original top downwards on a new substrate (comprising an oxidized surface layer). For example, the turn-over may take place after the creation of the active transistor layer of a double gate transistor (i.e., the top gate plus the Si source, drain and channel areas). In a subsequent step, the second gate can be manufactured on the (then) surface area of the die D.

Due to the turnover of the dies, for example, around the Y axis, the first alignment marker MX will be in a mirrored position with respect to its original orientation.

In this mirrored position, the first alignment marker MX can not be used properly anymore. The asymmetry of the diffraction pattern causes that diffracted intensity is substantially aimed in another direction than the preferred direction of the optical detector system. Thus, alignment and overlay measurement on such turned-over alignment marker is seriously hindered.

Figure 3:
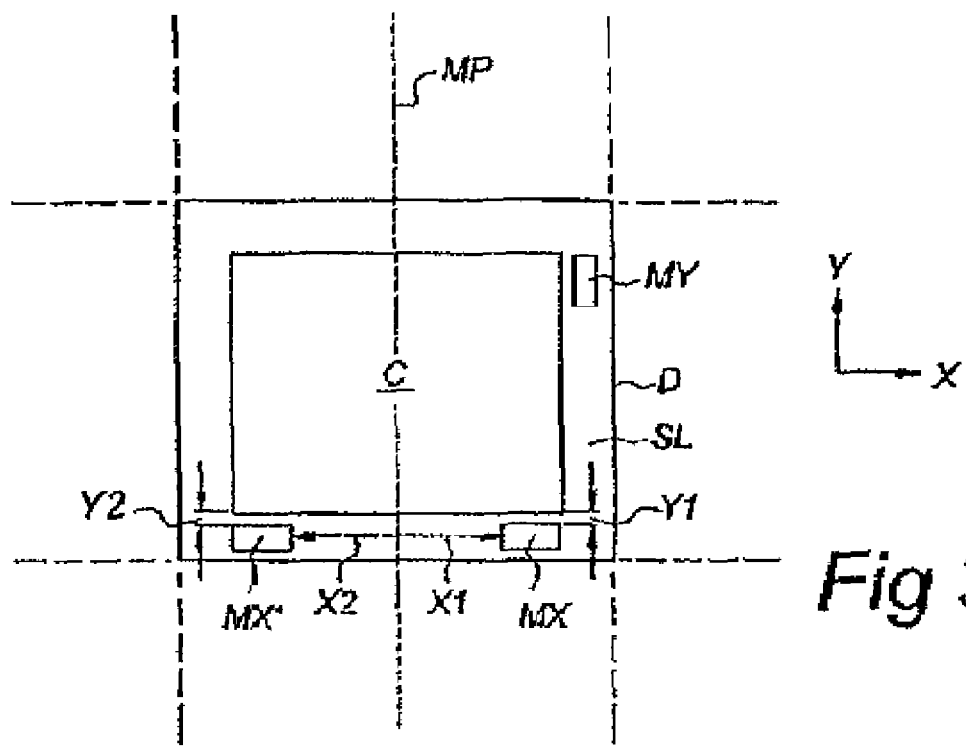
FIG. 3 schematically shows a plane view of a die comprising alignment markers manufactured according to the present invention.

FIG. 3 schematically shows a plane view of a die comprising alignment markers manufactured according to one embodiment of the present invention.

In FIG. 3 entities with the same reference number refer to identical entities as shown in the preceding figures.

According to the present invention, the method to make a marker (grating) MX for double gate SOI processing provides the creation of a mirrored marker (grating) MX' in the scribe line area SL, wherein such mirrored marker (grating) MX' is the mirror image of the marker MX.

The position of the mirrored marker (grating) MX' in the scribe line area SL is chosen to be mirror-symmetrical with respect to the location of the marker (grating) MX, by applying as mirror line MP the vertical symmetry line of the rectangular envelope of die D. In FIG. 3 the grating of mirrored first alignment marker MX' is located on the mirrored position of MX, as defined by the mirror line MP.

Thus, if the grating of MX is located at a horizontal position X1 relative to the mirror plane MP of the die D, then the mirrored grating of MX' is located at a second horizontal position X2, which distance to the mirror plane MP is equal to the distance X1. Further, the vertical position Y1 of MX and Y2 of MX' must be substantially equal.

It is noted that since the first alignment marker MX and the mirrored first alignment marker MX' are created during the same lithographic process, accurate positioning is straightforward.

The second alignment marker MY is not affected by the turn-over of the dies and may still be used for vertical alignment.

Figure 4:
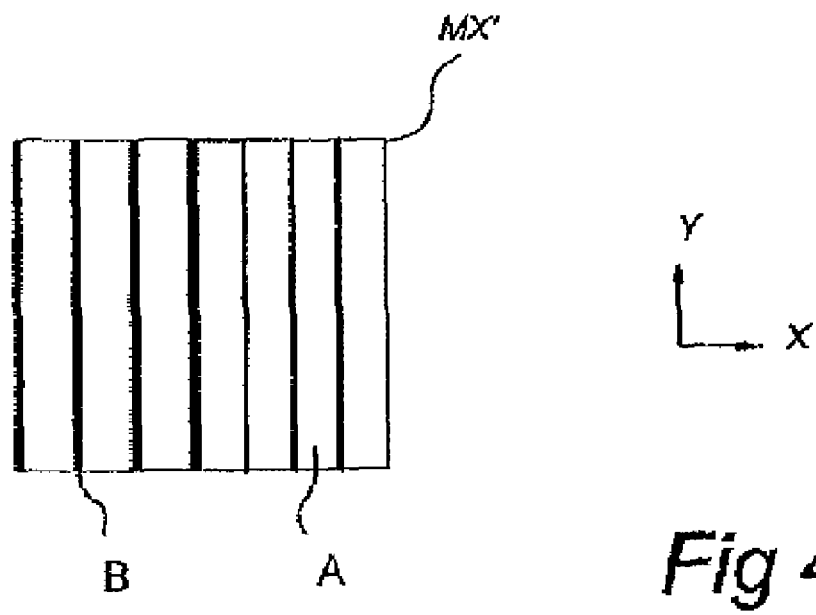
FIG. 4 schematically shows a plane view of a second alignment marker in accordance with the present invention.

FIG. 4 schematically shows a plane view of a second alignment marker in accordance with the present invention. The mirrored first alignment marker MX' comprises a structure which is mirrored relative to first alignment marker MX around the vertical direction.

In the specification above, the embodiments relate to double gate SOI processing. It is noted that for other semiconductor device manufacturing methods which may prefer to turn-over a die at some instance, other embodiments may also be used.

For example, aspects of the present invention may be applied for the manufacturing of heat sinks located at a backside of a die.

Other applications can be envisioned in relation to the possibility to have fully aligned processing on the backside of the original semiconductor device layer. For instance, one can remove the oxidized carrier Si substrate and transfer the semiconductor device layer onto another (e.g., non-Si or highly-resistive Si) substrate to allow fabrication of other components on the backside of the original semiconductor layer. Such components may comprise many types.

For example, quality of RF device components may greatly benefit from such a replacement of the original semiconductor layer with a new non-Si or highly-resistive Si substrate. In this respect, highly-resistive Si may be defined as Si having a resistivity above the standard value of 10-30 $\Omega$.cm ranging up to values of about $10^6$ $\Omega$.cm).

Other components may be, e.g., heat sink components, memory device components, analog device components, and high-voltage device components.

Also, integration with opto-electronic devices may be facilitated by this type of fully aligned processing of a turned-over semiconductor layer.

Persons skilled in the art will appreciate that the present invention is not limited to the aforementioned types of devices, but may be applicable in other electronic and/or micro-mechanic device types as well.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. A method of making at least one marker for double gate SOI processing on a SOI wafer,
   wherein the SOI wafer comprises a substrate, an oxidized layer on the substrate, and a semiconductor layer on top of the oxidized layer;
   wherein the double gate SOI processing is performed on at least one die;
   wherein the at least one die is located on the semiconductor layer and comprises at least an inner area arranged as a circuit area and an outer area arranged as scribe line area;
   wherein the double gate SOI processing comprises:
      separating the semiconductor layer from the oxidized layer, and
      attaching the separated semiconductor layer as a turned-over semiconductor layer on a surface of a new substrate, wherein the original top surface of the semiconductor layer is directed towards the surface of the new substrate,
   the method of making the at least one marker comprising:
      forming a first marker in a first direction in the scribe line area, said first marker having a diffraction structure wherein said diffraction structure is configured to generate an asymmetrical diffraction pattern during use in an alignment and overlay detection system for detection in said first direction; and
      forming a second marker in the first direction in the scribe line area, the second marker being a mirror image of the first marker, around a second direction perpendicular to said first direction.

2. The method according to claim 1, further comprising choosing a position of the second marker in the scribe line area along the first direction to be mirror-symmetrical with respect to the position of the first marker along the first direction, wherein choosing the position comprises choosing the position of the second marker to be the mirror image of the first marker around a mirror line, the mirror line being a symmetry line of the rectangular envelope of the die in the second direction.

3. The method according to claim 1, wherein the second marker is created in a same lithographic step as the first marker.

4. The method according to claim 3, wherein the semiconductor layer comprises a backside, and wherein the method further comprises a fully aligned processing of the backside of the semiconductor layer using lithographic alignment on the second marker.

5. The method according to claim 1, wherein the new substrate is one of a non-Si substrate and a Si substrate with a high resistivity.

6. The method according to claim 4, wherein the fully aligned processing comprises:
   forming at least one component of a heat sink, an RE device, a memory device, an analog device, or a high-voltage device.

7. The method according to claim 4, wherein the fully aligned processing comprises:
   forming at least one component of an opto-electronic device.

8. The method according to claim 4, wherein the fully aligned processing comprises:
   forming at least one component of a micro-mechanic device.

* * * * *